United States Patent
Yin et al.

(10) Patent No.: US 11,728,158 B2
(45) Date of Patent: *Aug. 15, 2023

(54) SEMICONDUCTOR STRUCTURE AND METHOD FOR PREPARING THE SAME

(71) Applicant: SJ Semiconductor(Jiangyin) Corporation, Jiangyin (CN)

(72) Inventors: Jiashan Yin, Jiangyin (CN); Zuyuan Zhou, Jiangyin (CN); Xingtao Xue, Jiangyin (CN); Chengchung Lin, Jiangyin (CN)

(73) Assignee: SJ Semiconductor (Jiangyin) Corporation, Jiangyin (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/465,687

(22) Filed: Sep. 2, 2021

(65) Prior Publication Data

US 2022/0076943 A1 Mar. 10, 2022

(30) Foreign Application Priority Data

Sep. 4, 2020 (CN) .......................... 202010921579.0
Sep. 4, 2020 (CN) .......................... 202021912432.7

(51) Int. Cl.
*H01L 21/02* (2006.01)
*H01L 21/768* (2006.01)
*H01L 23/522* (2006.01)
*H01L 23/48* (2006.01)

(52) U.S. Cl.
CPC .... *H01L 21/02074* (2013.01); *H01L 21/7684* (2013.01); *H01L 21/76898* (2013.01); *H01L 23/481* (2013.01); *H01L 23/522* (2013.01)

(58) Field of Classification Search
CPC ........... H01L 21/02074; H01L 21/7684; H01L 21/76898; H01L 23/481; H01L 23/522; H01L 21/76834; H01L 21/76883; H01L 21/743
USPC ................................................. 438/690–714
See application file for complete search history.

(56) References Cited

U.S. PATENT DOCUMENTS

| 7,701,060 | B2 * | 4/2010 | Tada | .................. H01L 21/76832 |
| | | | | 257/E21.585 |
| 2016/0233155 | A1 * | 8/2016 | Lee | .................... H01L 21/76898 |
| 2019/0004027 | A1 * | 1/2019 | Chen | .................. G01N 27/4148 |

FOREIGN PATENT DOCUMENTS

CN          109280919 A  *  1/2019  ................ C23F 1/18

* cited by examiner

*Primary Examiner* — Duy Vu N Deo
(74) *Attorney, Agent, or Firm* — Alston & Bird LLP

(57) ABSTRACT

The present disclosure provides a semiconductor structure and a method preparing it. After planarization of the Cu layer, a Si substrate is dry etched, so that a first height difference is configured in between the top surfaces of the the Si substrate and an insulating layer. By means of a wet etch process, Cu residues near an edge of a Cu post may be effectively removed. A second height difference is configured in between the top surfaces of the Cu post and the insulating layer. The first height difference is arranged to be greater than the second height difference. Channeling of Cu trace residues through the insulating layer are thereby avoided, effectively mitigating electrical leakage. Further, the Si substrate may be covered by a passivation layer, to prevent a conductive channel from being formed on the Si substrate, thereby further avoiding negative impact on the electrical properties of the device.

4 Claims, 2 Drawing Sheets

SEMICONDUCTOR STRUCTURE AND METHOD FOR PREPARING THE SAME

CROSS REFERENCE TO RELATED APPLICATION

The present application claims the benefit of priority to Chinese Patent Application No. CN 2020109215790, entitled "SEMICONDUCTOR STRUCTURE AND METHOD FOR PREPARING THE SAME", and Chinese Patent Application No. CN 2020219124327, entitled "SEMICONDUCTOR STRUCTURE", both filed with CNIPA on Sep. 4, 2020, the contents of which are incorporated herein by reference in its entirety for all purposes.

FIELD OF TECHNOLOGY

The present disclosure generally relates to the field of semiconductor manufacturing, and in particular, to a semiconductor structure and a method for preparing the same.

BACKGROUND

With the increasing functionality, performance, and integration of integrated circuits, packaging technology has been playing an increasingly important role in integrated circuit products, accounting for an increasing proportion of the values of the overall electronic systems. Wafer-level packaging (WLP) technology has become an important packaging method for the demanding mobile/wireless network and other electronic devices, and has moved up to one of the most promising packaging technologies due to its advantages of being able to miniaturize, low cost, high integration level, and better performance with higher energy efficiency.

Redistribution layers (RDLs) can rearrange the layout of chips' pads, so that the new layout can be assembled in an array. Therefore, the RDLs are widely applied in the WLP technology. With the development of packaging technology, RDL metal wires having high densities and small spacings are in urgent need.

In the current related art, copper (Cu) is widely used in the WLP technology as a conductive material. However, since Cu is malleable, it often leaves residue after a planarization process on a deposited Cu layer. As Cu residues cause contamination on the electrical properties of a prepared device having high densities and small spacings.

Therefore, it is necessary to provide a semiconductor structure and a method for preparing the device which can overcome the Cu residue problem and completely remove the Cu residues.

SUMMARY

The present disclosure provides a method for preparing a semiconductor structure, the method including:
providing a silicon (Si) substrate;
patterning the Si substrate to form a groove;
forming an insulating layer in the groove to cover a bottom surface and side walls of the groove;
forming a Cu layer and a Cu post to fill the groove;
performing planarization of Cu layer to expose the Si substrate, the insulating layer, and the Cu post;
dry etching the Si substrate to configure a first height difference between the Si substrate and the insulating layer;
performing a wet etch process to remove Cu residues and a part of the Cu post, so as to configure a second height difference between the Cu post and the insulating layer, and the first height difference is arranged to be greater than the second height difference; and
forming a passivation layer to cover the Si substrate, the insulating layer, and the Cu post.

Optionally, an etchant solution used during the wet etch process includes an acid solution for chemical reacting with Cu, and the acid solution includes one or more of an $H_2O_2$ solution, an $H_3PO_4$ solution, and an $H_2SO_4$ solution.

Optionally, the first height difference is in a range of 2 μm to 5 μm, and the second height difference is in a range of 0.1 μm to 0.5 μm.

Optionally, the planarization includes one or more of mechanical polishing and chemical mechanical polishing.

Optionally, after the insulating layer is formed and before the Cu post is formed in the groove, a step of forming a metal seed layer is also included.

The present disclosure also provides a semiconductor structure. The semiconductor structure includes a Si substrate having a groove, an insulating layer, a Cu post in the groove, and a passivation layer. The Cu post is located in the Si substrate; the insulating layer covers side walls and a bottom of the Cu post and is in contact with the Si substrate, the passivation layer covers the Si substrate, the insulating layer, and the Cu post. A first height difference is configured in between top surfaces of the Si substrate and the insulating layer, a second height difference is configured in between the top surfaces of the Cu post and the insulating layer, and the first height difference is configured to be greater than the second height difference.

Optionally, the first height difference is in a range of 2 μm to 5 μm.

Optionally, the second height difference is in a range of 0.1 μm to 0.5 μm.

Optionally, a metal seed layer is further formed between the insulating layer and the Cu post in the groove, and the metal seed layer is arranged to be at the same height as the Cu post.

Optionally, the insulating layer includes one or more of a $SiO_2$ layer and a $Si_3N_4$ layer. The passivation layer includes one or the combination of a $SiO_2$ layer and a $Si_3N_4$ layer.

As described above, according to the semiconductor structure and the method for preparing the same of the present disclosure, after planarization on the Cu layer, a Si substrate is dry etched, so that a first height difference is formed between the Si substrate and an insulating layer. By means of a wet etch process, Cu residues near an edge of a Cu post may be effectively removed, and a second height difference is formed between the Cu post and the insulating layer. The first height difference is arranged to be greater than the second height difference. In this way, a connection of Cu materials at both sides of the insulating layer may be avoided, thereby effectively avoiding Cu contamination impact on electrical properties of the device. Further, the Si substrate may be effectively covered by using a passivation layer, to prevent a conductive channel from being formed on the Si substrate in a follow-up process, so as to achieve a desirable insulation effect, thereby further avoiding negative impact on the electrical properties of the device.

REFERENCE NUMERALS

Figure 1:
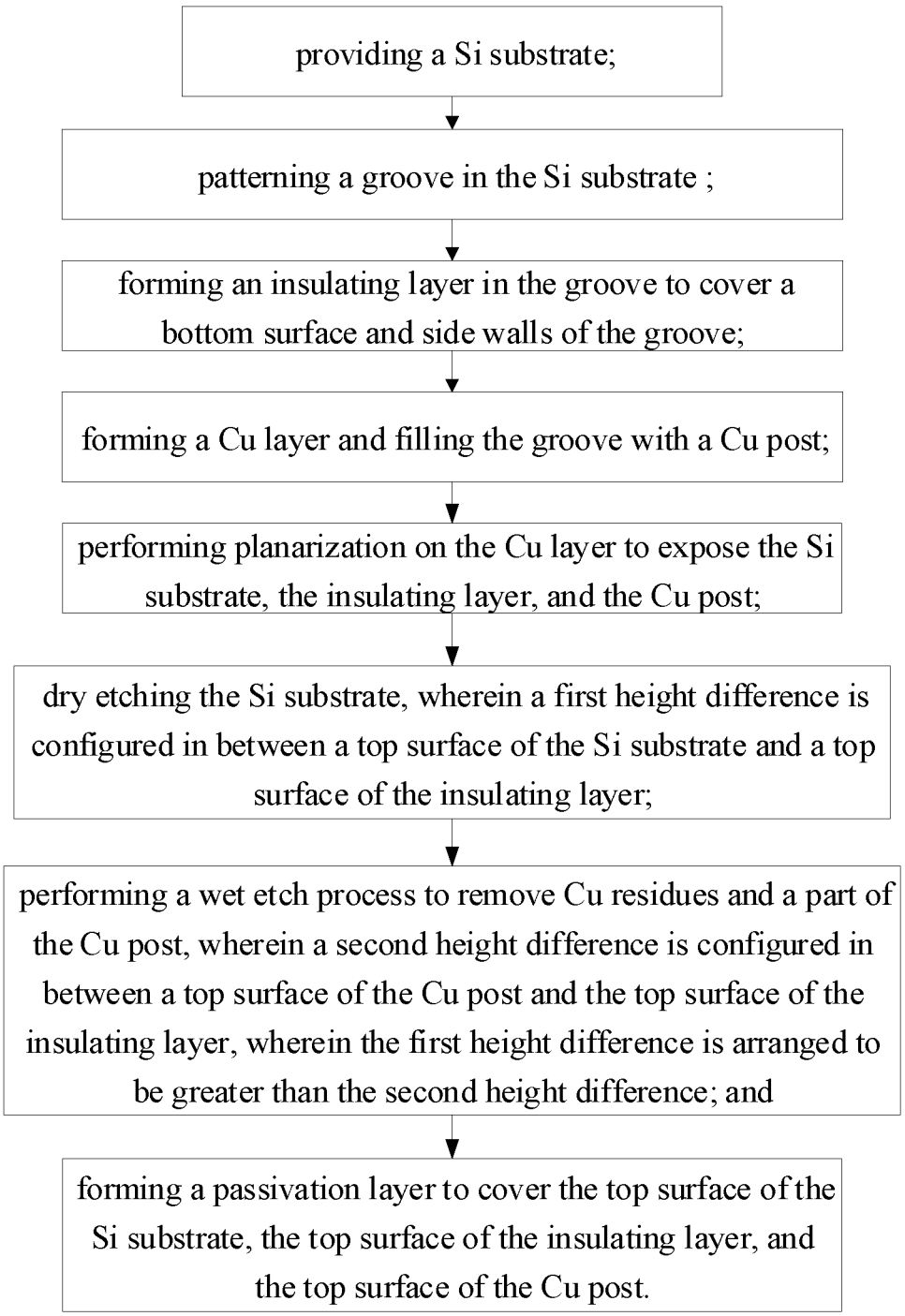
FIG. 1 is a flow chart of a process for preparing a semiconductor structure according to an embodiment.
Figure 2:
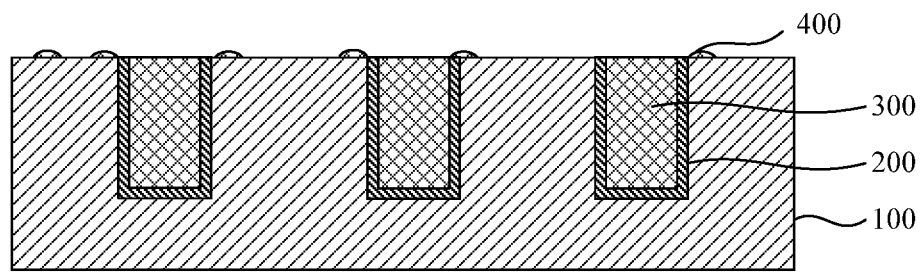
FIG. 2 is a schematic structural diagram after planarization of a deposited Cu layer according to an embodiment.

100 Si substrate
200 Insulating layer
300 Cu post
400 Cu residue
500 Passivation layer
D1 First height difference
D2 Second height difference

DETAILED DESCRIPTION

The implementations of the present disclosure are described below through specific examples. A person skilled in the art can easily understand other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

For example, when describing the embodiments of the present disclosure in detail, for ease of description, cross-sectional views for showing device structures are partially enlarged, not necessarily to scale and the schematic diagrams are merely exampled and are not intended to limit the scope of the present disclosure. In addition, three-dimensional dimensions including length, width, and depth should be included during actual fabrication.

For ease of description, spatial terms, such as "under", "below", "lower", "beneath", "above", "upper", and the like, may be used herein to describe the relationship between one element or feature and another element or feature as shown in the accompanying drawings. It is to be understood that these spatial terms are intended to encompass other directions of the device in use or operation than the directions depicted in the accompanying drawings. In addition, when a layer is referred to as being "between" two layers, the layer may be the only layer between the two layers, or one or more layers may be present therebetween. As used herein, "between . . . and . . . " means that two endpoint values are included.

In the context of this application, a structure in which a first feature is described as being "on" a second feature may include an embodiment in which the first feature and the second feature are in direct contact with each other, or may include an embodiment in which there is another feature formed between the first feature and the second feature. In other words, the first feature and the second feature may not be in direct contact with each other.

It is to be noted that, the drawings provided In an embodiment are merely used as examples to describe the basic conception of the present disclosure. Therefore, only assemblies related to the present disclosure are shown in the drawings, but are not drawn based on a quantity, shapes, and sizes of assemblies during actual implementation. Patterns, quantities, and ratios of the assemblies during the actual implementation may be changed randomly, and a layout of the assemblies may be more complicated.

Referring to FIGS. 1 to 5, the present disclosure provides a method for preparing a semiconductor structure according to one embodiment of the disclosure. The method includes the following steps of:

providing a Si substrate 100;
patterning the Si substrate 100 to form a groove (not shown in the figures);
forming an insulating layer 200 in the groove to cover a bottom and side walls of the groove;
forming a Cu post 300 to fill the groove;
performing planarization to expose the Si substrate 100, the insulating layer 200, and the Cu post 300;
dry etching the Si substrate 100 to form a first height difference D1 between the Si substrate 100 and the insulating layer 200;
performing a wet etch process to remove Cu residues 400 and a part of the Cu post 300, so as to form a second height difference D2 between the Cu post 300 and the insulating layer 200, the first height difference D1 being greater than the second height difference D2; and
forming a passivation layer 500 to cover the Si substrate 100, the insulating layer 200, and the Cu post 300.

According to the method for preparing a semiconductor structure, after planarization of the deposited Cu layer, a part of the top surface of the Si substrate 100 is removed by dry etching, so that a first height difference D1 is configured in between the Si substrate 100 and an insulating layer 200. By means of a wet etch process, Cu residues 400 may be removed, a second height difference D2 is configured in between the Cu post 300 and the insulating layer 200, and the first height difference D1 is arranged to be greater than the second height difference D2, so that connections of Cu materials at both sides of the insulating layer 200 may be avoided, thereby effectively avoiding negative impact on electrical properties of the device. Further, the Si substrate 100 may be effectively covered by using the passivation layer 500, to prevent a conductive channel from being formed on the Si substrate 100 in a follow-up process, so as to achieve a desirable insulation effect, thereby further avoiding negative impact on the electrical properties of the device.

Referring to FIG. 1, the Si substrate 100 is first provided and patterned to form the groove (not shown in the figure).

Specifically, the method of patterning the Si substrate 100 may adopt a photolithographing method. For example, the patterning is performed by using a mask, and a photoresist, but the present disclosure is not limited thereto. The depth, width, and layout of the groove may be selected as required, and are not excessively limited herein.

Then, the insulating layer 200 is formed in the groove to cover the bottom surface and the side walls of the groove.

As an example, the insulating layer 200 includes one or more of a $SiO_2$ layer and a $Si_3N_4$ layer. By means of the insulating layer 200 covering the bottom and side walls of the groove, a conductive channel may be effectively prevented from being formed between the Si substrate 100 and a Cu post 300 that is subsequently formed, thereby achieving a desirable insulation effect. The specific formation method, thickness, and material of the insulating layer 200 may be selected as required, and are not limited herein. In an embodiment, the insulating layer 200 adopts the $SiO_2$ layer, but the present disclosure is not limited thereto. The insulating layer 200 may also adopt the $Si_3N_4$ layer or stacked layers comprising a $SiO_2$ layer and $Si_3N_4$ layer.

As an example, after the forming an insulating layer 200 and before the forming a Cu post 300, the method further includes forming a metal seed layer (not shown in the figures).

Specifically, the metal seed layer may be formed on a surface of the insulating layer 200 by a PVD method, and may include a Ti/Cu seed layer or a Cu seed layer, which is not limited thereto and may be specifically selected as required. Preferably, the metal seed layer adopts the Cu seed layer, so that the metal seed layer has the same etching rate and top surface or height as the Cu post 300 during a subsequent formation of the second height difference D2, thereby preventing the metal seed layer from being connected to Cu materials outside the insulating layer 200.

Then, the Cu post 300 is formed in the substrate to fill the groove.

Specifically, when the metal seed layer is formed in the groove, the Cu post 300 may be formed by an electroplating method, but the present disclosure is not limited thereto. For example, the Cu post 300 may also be prepared by using a patterned mask and a deposition method, which is not limited herein.

Then, the planarization of the deposited Cu layer is performed to expose the top surfaces of the Si substrate 100, the insulating layer 200, and the Cu post 300.

As an example, the planarization includes one or more of mechanical polishing and chemical mechanical polishing.

Specifically, In an embodiment, a relatively flat surface may be obtained by means of mechanical polishing and smooth surface is achieved by chemical mechanical polishing.

However, the planarization process is not limited thereto, for example, either mechanical polishing or chemical mechanical polishing can be adopted as required. However, since Cu has good malleability, Cu residues 400 tend to accumulate near a corner edge of the Cu post 300 during the planarization of Cu process, and Cu residues can develop contamination traces which has negative impact on the electrical properties of the subsequently prepared device having high densities and small spacings. Therefore, the Cu residues 400 shown in FIG. 2 have to be completely removed.

Figure 3:
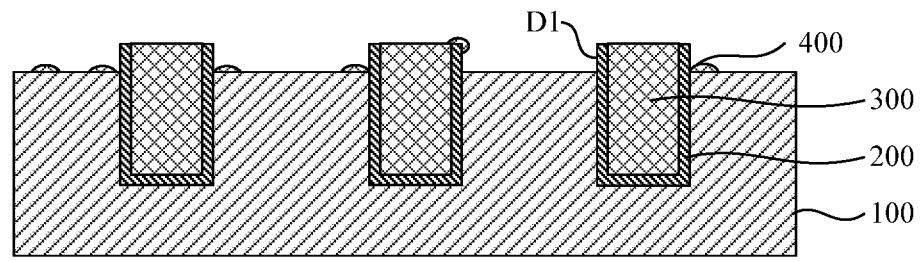
FIG. 3 is a schematic structural diagram after dry etching the Si substrate according to an embodiment.

Referring to FIG. 3, the Si substrate 100 is dry etched to a lower top surface than that of the insulating layer, a first height difference D1 is configured in between the Si substrate 100 and the insulating layer 200.

Specifically, by means of dry etching, the first height difference D1 may be formed between the Si substrate 100 and the insulating layer 200, so as to effectively expose the Cu residues 400. Therefore, in a follow-up process, the Cu residues 400 may be effectively removed to avoid the connection to Cu materials at both sides of the insulating layer 200, thereby effectively avoiding negative impact on the electrical properties of the device.

As an example, the first height difference D1 is in a range of 2 μm to 5 μm.

Specifically, a larger value of the first height difference D1 facilitates better barrier to the Cu residues 400 to contact the Cu post 300. However, an excessively large first height difference D1 may weaken the insulating layer 200 so it may generate defects such as cracks in the follow-up polishing process, which risks electrical conduction between the Cu post 300 and the Si substrate 100 instead. Therefore, In an embodiment, the first height difference D1 is preferably set at about 3 μm, but the present disclosure is not limited thereto, and the first height difference D1 may also be set at, for example, about 2 μm, 4 μm, or the like.

Figure 4:
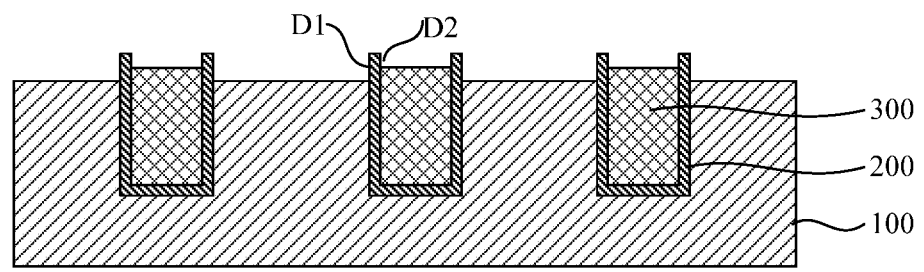
FIG. 4 is a schematic structural diagram after a wet etch process on the Cu layer according to an embodiment.

Then, referring to FIG. 4, by a wet etch process, the Cu residues 400 and a part of the Cu post 300 may be removed, so as to form the second height difference D2 between the top surfaces of the Cu post 300 and the insulating layer 200, and the first height difference D1 is arranged to be greater than the second height difference D2.

As an example, an etchant solution used during the wet processing includes an acid solution for a chemical reaction with Cu, and the acid solution includes one or more of an $H_2O_2$ solution, an $H_3PO_4$ solution, and an $H_2SO_4$ solution.

Specifically, by means of wet etch process in the acid solution, the Cu residues 400 on an edge of the Cu post 300 may be effectively removed. Further, the acid solution may also remove a part of the top surface of the Cu post 300, so that the second height difference D2 is formed between the top surfaces of the Cu post 300 and the insulating layer 200, and the first height difference D1 is arranged to be greater than the second height difference D2. In this way, the Cu residues 400 may be completely blocked from channeling into the Cu post 300, so as to enhance the electrical properties of the device that is subsequently prepared.

As an example, the second height difference D2 is in a range of 0.1 μm to 0.5 μm.

Specifically, a larger value of the second height difference D2 facilitates better barriers to prevent Cu residues 400 from contacting the Cu post 300. However, an excessively large second height difference D2 may weaken the insulating layer 200 so it is vulnerable to generating defects such as cracks in the follow-up polishing process, which risks electrical channeling between the Cu post 300 and the Si substrate 100 instead. Therefore, In an embodiment, the second height difference D2 is preferably set at about 0.3 μm, but the present disclosure is not limited thereto, and the second height difference D2 may also be, for example, 0.2 μm, 0.4 μm, or the like.

Figure 5:
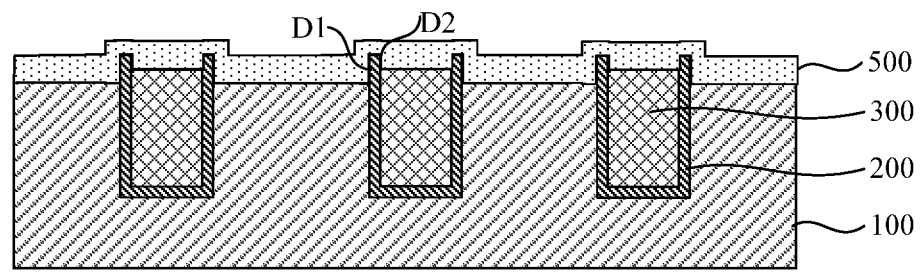
FIG. 5 is a schematic structural diagram after a passivation layer is formed according to an embodiment.

Then, referring to FIG. 5, a passivation layer 500 is deposited to cover the top surfaces of the Si substrate 100, the insulating layer 200, and the Cu post 300.

As an example, the passivation layer 500 includes one or more of a $SiO_2$ layer and a $Si_3N_4$ layer.

Specifically, the top surfaces of the Si substrate 100 may be effectively covered with the passivation layer 500, to prevent any undesirable conductive channels from being formed between any metals and the Si substrate 100 in a follow-up process, thereby achieving a desirable insulation effect. A specific formation method, thickness, and material of the passivation layer 500 may be decided as required, and are not limited herein. In an embodiment, the passivation layer 500 adopts the $SiO_2$ layer, but the present disclosure is not limited thereto. The passivation layer 500 may also adopt the $Si_3N_4$ layer or stacked layers of a $SiO_2$ layer and $Si_3N_4$ layer.

Referring to FIG. 5, the present disclosure further provides a semiconductor structure. The semiconductor structure may be prepared by using the foregoing method, but the present disclosure is not limited thereto.

Specifically, the semiconductor structure includes a Si substrate 100 with a groove, an insulating layer 200, a Cu post 300, and a passivation layer 500. The Cu post 300 is located in the groove in the Si substrate 100, the insulating layer 200 covers side walls and a bottom surface of the Cu post 300 and is in contact with the Si substrate 100, and the passivation layer 500 covers the Si substrate 100, the insulating layer 200, and the Cu post 300. A first height difference D1 is configured in between the Si substrate 100 and the insulating layer 200, and a second height difference D2 is configured in between the Cu post 300 and the insulating layer 200. The first height difference D1 is arranged to be greater than the second height difference D2.

In the semiconductor structure of the present disclosure, since a first height difference D1 is configured in between the Si substrate 100 and the insulating layer 200, a second height difference D2 is configured in between the Cu post 300 and the insulating layer 200, and the first height difference D1 is arranged to be greater than the second height difference D2, so that electrical leakage due to Cu materials traveling through the two sides of the insulating layer 200 can be avoided, thereby effectively avoiding the negative impact on electrical properties of the device. Further, the Si substrate 100 may be effectively covered by the passivation layer 500 to further prevent a conductive channel from being formed on the Si substrate 100 in a follow-up process, so as to achieve a desirable insulation effect, thereby further avoiding negative impact on the electrical properties of the device.

As an example, the first height difference D1 is in a range of 2 μm to 5 μm.

Specifically, a larger value of the first height difference D1 facilitates a better barrier for the Cu residues to contact the Cu post 300. However, an excessively large first height difference D1 may weaken the insulating layer 200 so defects such as cracks may be generated in the follow-up polishing process, which risks electrical channeling conduction between the Cu post 300 and the Si substrate 100 instead. Therefore, in an embodiment, the first height difference D1 is preferably 3 μm, but the present disclosure is not limited thereto, and the first height difference D1 may also be set at, for example, about 2 μm, 4 μm, or the like.

As an example, the second height difference D2 is in a range of 0.1 μm to 0.5 μm.

Specifically, a larger value of the second height difference D2 facilitates a better barrier prevention of the Cu residues from contacting the Cu post 300. However, an excessively large second height difference D2 may weaken the insulating layer 200 so defects such as cracks can be generated in the follow-up polishing process, which risks electrical conduction between the Cu post 300 and the Si substrate 100 instead. Therefore, in an embodiment, the second height difference D2 is preferably set at about 0.3 μm, but the present disclosure is not limited thereto, and the second height difference D2 may also be set at, for example, about 0.2 μm, 0.4 μm, or the like.

As an example, a metal seed layer (not shown in the figures) is further formed between the insulating layer 200 and the Cu post 300, and the metal seed layer has the same height as the Cu post 300.

Specifically, the metal seed layer may include a Ti/Cu seed layer or a Cu seed layer, but the present disclosure is not limited thereto, which may be specifically selected as required. Preferably, the metal seed layer adopts the Cu seed layer, and the Cu seed layer has the same height as the Cu post 300, so as to prevent the metal seed layer from being connected to Cu materials outside the insulating layer 200.

As an example, the insulating layer 200 includes one or more of a $SiO_2$ layer and a $Si_3N_4$ layer.

Specifically, the insulating layer 200 may effectively prevent a conductive channel from being formed between the Cu post 300 and the Si substrate 100, thereby achieving a desirable insulation effect. The specific formation method, thickness, and material of the insulating layer 200 may be selected as required, and are not excessively limited herein. In an embodiment, the insulating layer 200 adopts the $SiO_2$ layer, but the present disclosure is not limited thereto. The insulating layer 200 may also adopt the $Si_3N_4$ layer or stacked layers comprising a $SiO_2$ layer and $Si_3N_4$ layer.

As an example, the passivation layer 500 includes one or more of a $SiO_2$ layer and a $Si_3N_4$ layer.

Specifically, the Si substrate 100 may be effectively covered by the passivation layer 500, to prevent a conductive channel from being formed on the Si substrate 100 in a follow-up process, thereby achieving a desirable insulation effect. The specific formation method, thickness, and material of the passivation layer 500 may be selected as required, and are not limited herein. In an embodiment, the passivation layer 500 adopts the $SiO_2$ layer, but the present disclosure is not limited thereto. The passivation layer 500 may also adopt the $Si_3N_4$ layer or stacked layers comprising a $SiO_2$ layer and $Si_3N_4$ layer.

Based on the above, according to the semiconductor structure and the method for preparing the same of the present disclosure, after planarization, a Si substrate is dry etched, so that a first height difference is formed between the Si substrate and an insulating layer. By means of wet processing, Cu residues near an edge of a Cu post may be effectively removed, and a second height difference is formed between the Cu post and the insulating layer. The first height difference is greater than the second height difference. In this way, a connection of Cu materials at both sides of the insulating layer may be avoided, thereby effectively avoiding negative impact on electrical properties of the device. Further, the Si substrate may be effectively covered by using a passivation layer, to prevent a conductive channel from being formed on the Si substrate in a follow-up process, so as to achieve a desirable insulation effect, thereby further avoiding negative impact on the electrical properties of the device.

The foregoing embodiments merely exemplify the principles and effects of the present disclosure, but are not intended to limit the scope of the present disclosure. Any person skilled in the art may make modifications or changes to the foregoing disclosure without departing from the spirit and scope of the present disclosure. Therefore, any equivalent modifications or changes completed by a person of ordinary skill in the art without departing from the spirit and technical concept disclosed in the present disclosure should fall within the scope of the claims of the present disclosure.

What is claimed is:

1. A method for preparing a semiconductor structure, comprising following steps of:
    providing a Si substrate;
    patterning a groove in the Si substrate;
    forming an insulating layer in the groove to cover a bottom surface and side walls of the groove;
    forming a Cu layer and filling the groove with a Cu post;
    performing planarization on the Cu layer to expose the Si substrate, the insulating layer, and the Cu post;
    dry etching the Si substrate, wherein a first height difference is configured in between a top surface of the Si substrate and a top surface of the insulating layer;
    performing a wet etch process to remove Cu residues and a part of the Cu post, wherein a second height difference is configured in between a top surface of the Cu post and the top surface of the insulating layer, wherein the first height difference is arranged to be greater than the second height difference, wherein the first height difference is in a range of 2 μm to 5 μm and the second height difference is in a range of 0.1 μm to 0.5 μm; and
    forming a passivation layer to cover the top surface of the Si substrate, the top surface of the insulating layer, and the top surface of the Cu post.

2. The method for preparing the semiconductor structure according to claim 1, wherein an etchant solution used during the wet etch process comprises an acid solution for a chemical reaction with Cu, wherein the acid solution comprises one or more of an $H_2O_2$ solution, an $H_3PO_4$ solution, and an $H_2SO_4$ solution.

3. The method for preparing the semiconductor structure according to claim 1, wherein the planarization of the Cu layer comprises one or more of mechanical polishing and chemical mechanical polishing.

4. The method for preparing the semiconductor structure according to claim 1, wherein after the forming the insulating layer and before the forming the Cu post, the method further comprises forming a metal seed layer.

* * * * *